United States Patent [19]

Chalco et al.

[11] Patent Number: 4,894,509
[45] Date of Patent: Jan. 16, 1990

[54] LASER ASSISTED HEATER BAR FOR MULTIPLE LEAD ATTACHMENT

[75] Inventors: Pedro A. Chalco, Yorktown Heights; Joseph C. Andreshak, Mahopac, both of N.Y.

[73] Assignee: International Business Machines Corporation, Armonk, N.Y.

[21] Appl. No.: 283,668

[22] Filed: Dec. 13, 1988

[51] Int. Cl.[4] .............................................. B23K 26/00
[52] U.S. Cl. ............................ 219/121.6; 219/121.85; 219/121.64; 219/121.63; 219/85.13; 219/85.16
[58] Field of Search ............ 219/121.6, 121.85, 121.63, 219/121.64, 85 D, 85 BM

[56] References Cited

U.S. PATENT DOCUMENTS

| | | | |
|---|---|---|---|
| 3,509,317 | 4/1970 | Valsamakis et al. | 219/258 |
| 3,522,407 | 8/1970 | Costello | 219/85 |
| 3,657,508 | 4/1972 | Studnick | 219/85 |
| 3,718,800 | 2/1973 | Costello | 219/85 |
| 3,723,697 | 3/1973 | King | 219/85 |
| 3,742,181 | 6/1973 | Costello | 219/85 |
| 4,534,811 | 8/1985 | Ainslie et al. | 219/121.6 |
| 4,785,156 | 11/1988 | Benko et al. | 219/121.64 |

Primary Examiner—C. L. Albritton
Attorney, Agent, or Firm—Perman & Green

[57] ABSTRACT

A laser assisted miniature heater 10 includes an elongated hollow bar 12 having a high thermal conductivity and a supporting member 14 for conveying an optical fiber 16 which transmits laser radiation to an interiorly disposed hollow cavity 18. The interior surfaces 20 of the cavity 18 are reflective to the laser radiation such that the radiation undergoes repetitive internal reflections along a longitudinal axis of the bar 12. While repetitively reflecting within the cavity 18 the laser radiation is gradually absorbed into the walls of the cavity 18. The absorption of the laser radiation induces a uniform heating of the bar 12 to a temperature which exceeds the melting temperature of eutectic solder. The outer surface 22 of the bar 12, when placed in contact with a plurality of component leads which are each adjacent to a respective solder-bearing bonding pad, induces a melting of the solder and the physical and electrical coupling of the leads to their associated bonding pads.

19 Claims, 3 Drawing Sheets

LASER ASSISTED HEATER BAR FOR MULTIPLE LEAD ATTACHMENT

FIELD OF THE INVENTION

This invention relates generally to method and apparatus for electronic device lead attachment and, in particular, to a miniature heater bar which includes a reflective internal chamber region having laser radiation directed therein for uniformly heating the bar above the melting temperature of solder.

BACKGROUND OF THE INVENTION

Some conventional electronic lead attachment apparatus employ a laser beam to deliver a high energy pulse to a lead which is to be attached. The lead is thereby bonded to a metallic terminal, such as a bonding pad, by the melting and subsequent freezing of eutectic solder material. One problem associated with such a soldering operation, wherein where either the solder is heated directly or a lead is heated to melt the solder, is that only a relatively small portion of the laser energy is utilized for heating while a significant portion of the energy is reflected or scattered. In addition to this inefficiency resulting from the laser reflection the reflected laser radiation may pose a safety hazard to personnel in the immediate vicinity. Wavelength optimization of the laser beam to maximize absorption has been found to reduce but not eliminate the energy losses.

Another problem which is encountered with conventional laser soldering methodology is related to the sequential nature of the process and the significant amount of time required to solder all of the leads of an electronic device. In that modern electronic components may have one hundred or more leads, and a typical assemblage of such components may comprise some arbitrarily large number of components, a significant amount of time and cost is required to attach all of the leads to bonding pads. Related to this problem is the necessary repositioning of either the laser beam or the leads between soldering operations. That is, each lead is individually exposed to the laser beam by either an x-y positioning of the component or by optically scanning the beam over stationary leads. In both cases, the maximum rate of lead attachment has been found to be only approximately 10 leads per second.

In view of the above mentioned and other problems it can be appreciated that the use of laser soldering for component attachment may be less than an optimum technique in spite of the high process reliability and high joint quality produced by this technique.

Other soldering apparatus such as electrically heated tools may deliver too much heat to a localized area of a component or a printed circuit board, resulting in failure of the component or physical damage to the printed circuit board.

It is thus one object of the invention to provide a laser soldering apparatus and method which utilizes a significantly greater portion of the laser beam power than conventional techniques while also eliminating the possibility that laser radiation will be reflected or scattered into the environment.

It is another object of the invention to provide a laser soldering apparatus and method which is capable of simultaneously soldering a plurality of leads to associated bonding pads, thereby significantly increasing the speed and reducing the costs associated with conventional laser soldering techniques.

SUMMARY OF THE INVENTION

The foregoing problems are overcome and the objects of the invention are realized by a laser assisted miniature heater which includes a structure having a hollow cavity enclosed within and a supporting member for conveying an optical fiber which transmits optical radiation, such as laser radiation, to the hollow cavity. The support member may be centered perpendicular over the hollow structure or may be inclined at an angle to the structure. The interior surfaces of the cavity are reflective to the laser radiation such that the radiation undergoes repetitive internal reflections along a longitudinal axis of the structure while being absorbed. The absorption of the laser radiation induces a uniform heating of the structure to a temperature which exceeds the melting temperature of eutectic solder. The outer surface of the hollow structure, when placed in contact with a plurality of component leads which are each adjacent to a respective solder-bearing bonding pad, induces a melting of the solder and the physical and electrical coupling of the leads to their associated bonding pads.

BRIEF DESCRIPTION OF THE DRAWING

The foregoing and other aspects of the invention will be made more apparent in the ensuing Detailed Description of the Invention when read with conjunction with the accompanying Drawing, wherein.

DETAILED DESCRIPTION OF THE INVENTION

Figure 1:
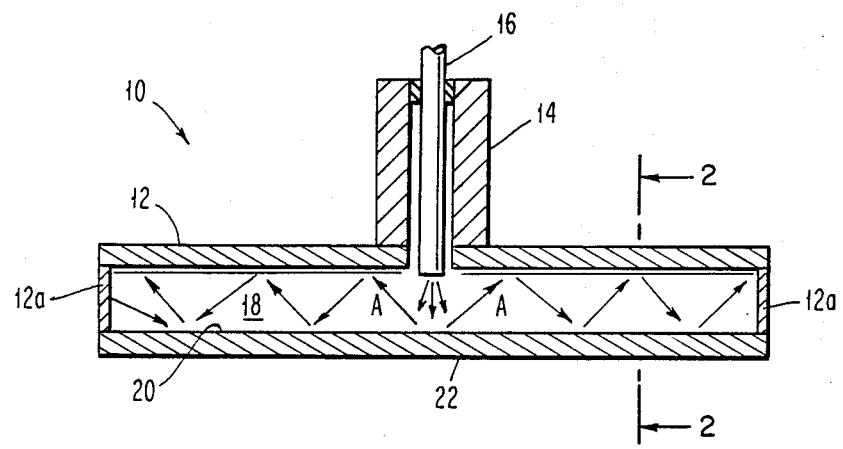
FIG. 1 is a front cut-away view of one embodiment of a heater bar constructed in accordance with the invention.
Figure 1A:
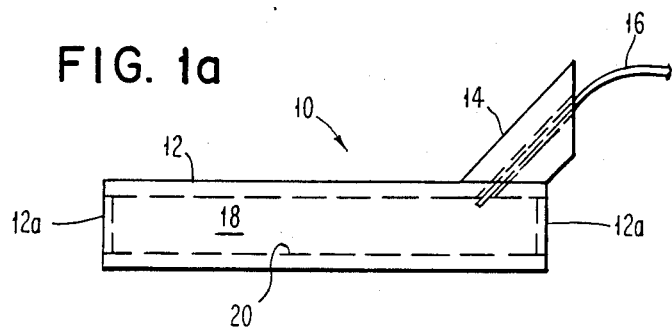
FIG. 1a is a front view of another embodiment of the heater bar of the invention.
Figure 2:
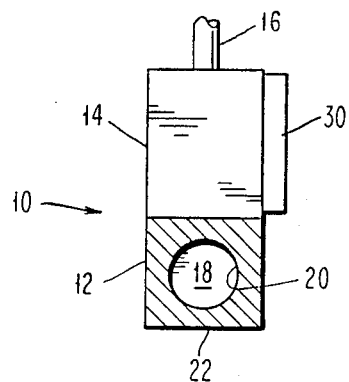
FIG. 2 is a side cut-away view of the heater bar of FIG. 1.

Referring first to FIGS. 1 and 2 there is shown a laser assisted miniature heater 10 which includes an elongated hollow structure, or bar, 12 having a high thermal conductivity and a supporting member 14 for conveying an optical fiber 16 which transmits laser radiation, indicated by the arrows A, to an interiorly disposed hollow chamber region or cavity 18. The support member 14 may be centered perpendicular over the bar 12 or may be offset and/or inclined at an angle, as shown in FIG. 1a to the bar 12. The interior surfaces 20 of the cavity 18 are prepared to be reflective to the laser radiation such that the radiation undergoes repetitive internal reflections along a longitudinal axis of the bar 12. While repetitively reflecting within the cavity 18 the laser radiation is gradually absorbed into the walls of the cavity 18. The absorption of the laser radiation induces a uniform heating of the bar 12 to a temperature which exceeds the melting temperature of eutectic solder, or approximately 183° C. The outer surface 22 of the bar 12, when placed in contact with a plurality of component leads which are each adjacent to a respective solder-bearing bonding pad, induces a melting of the solder and the physical and electrical coupling of the leads to their associated bonding pads.

Preferably the outer surface of the bar 12 is coated with a material which resists wetting with solder The substrate material of the bar 12 can be constructed of any suitable material which will provide mechanical strength to the bar, is thermally conductive, and does not interdiffuse with the internal and external coatings. Aluminum and copper are two examples. Good adhesion of the interior and exterior coatings to the substrate is also highly desirable.

Figure 3:
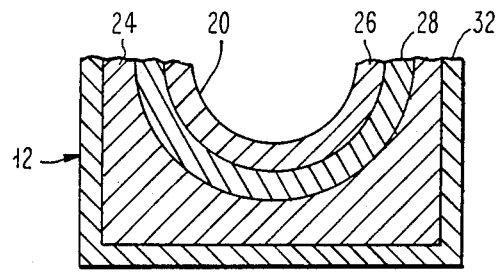
FIG. 3 is a side cut-away view showing a portion of the heater bar and illustrating various metallic layers which comprise the bar, the view of FIG. 3 not being to scale.

In accordance with one embodiment of the invention, and referring also to FIG. 3, the bar 12 and support 4 are machined from copper stock in a T-like configuration to form a copper substrate 24. The bar 12 may have a total length of approximately one to approximately 2.5 centimeters and a width and height of approximately 1.25 mm. In this regard the length should be at least long enough to simultaneously contact a plurality of adjacently disposed component leads while not having a length which induces a substantial thermal gradient between the center of the bar and the ends. This latter consideration is of course a function of the magnitude of the input laser energy. A hole or channel is bored through the copper substrate 24 from one end to another to form the cavity 18 therein, the cavity having a typical diameter of approximately 0.8 mm. The interior surfaces of the cavity 18 are chemically polished and coated with a reflective layer 26, such as layer of gold, to a depth of approximately one micron. A conventional gold immersion process may be employed to coat the interior surfaces. In that the channel is bored completely through the bar 12 the flowing of the gold plating solution through the bar is facilitated. Preferably, a barrier layer 28, such as a nickel flash or a layer of platinum, is first applied to prevent the interdiffusion of the copper substrate and the gold coating. Such interdiffusion is undesirable in that over time the reflectivity of the surface 20 would be diminished. An external non-wetting coating 32, such as titanium, is applied to prevent the adhesion of molten solder to the exterior of the copper bar 12. After fabrication the open ends of the cavity 18 are sealed to prevent the escape of laser radiation therefrom. The sealing can be accomplished by inserting a metal paste into the ends of the bar 12, the paste subsequently being cured and hardened. Preferably, the ends are sealed with a reflective material, such as a layer of gold foil 12a, to reflect back into the cavity any laser radiation that reaches the ends of the cavity 18 without being absorbed.

The support member 14 has an opening made therethrough of a diameter suitable for accommodating the optical fiber 16 therein. The end of fiber 16, which may be polished flat or otherwise modified to alter the delivery characteristics of the beam, communicates with cavity 18 for coupling the optical radiation into the cavity. The fiber 16 is fixed in position by a suitable adhesive or by a mechanical means such as one or more O-rings. In that the support 14 is integrally formed with the copper bar 12 a thermal insulator, such as a thermally insulating gasket or pad 30, can be employed to insulate the heater 10 from other structure, such as a clamp (not shown), which is attached to the support 14. Alternatively, or in combination with the thermal insulator, the support 14 is comprised of a material having a lower thermal conductivity, such as stainless steel, to reduce heat loss from the bar 12. For this latter embodiment the bar 12 is fabricated and coated as previously described and the support 14 subsequently attached by, for example, a brazing operation.

Figure 4:
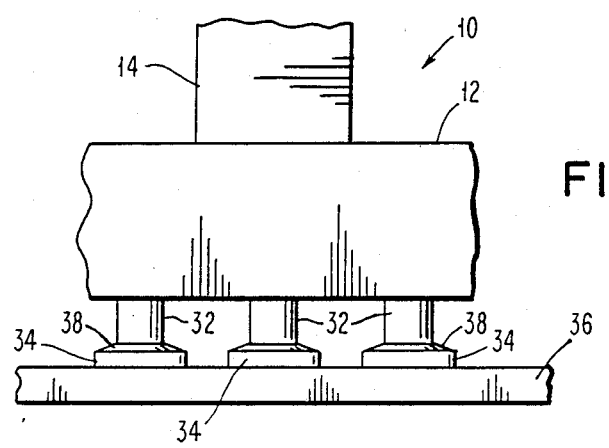
FIG. 4 illustrates the heater bar of the invention being used to simultaneously solder a plurality of component leads to associated bonding pads.

Referring to FIG. 4 there is shown the miniature heater 10 in an illustrative application for soldering a plurality of component leads 32, seen on end, each to a respective bonding pad 34. The leads 32 may be attached to an electronic device, such as a memory device (not shown). The bonding pads 34 are typically provided on the surface of an insulating substrate 36, such as a printed circuit board. Each of the pads 34 is typically initially prepared by a conventional screening or plating operation to deposit a layer of solder paste 38 upon the pads 34. In operation the bar 12 is contacted to the leads 32 and laser radiation is applied to the cavity 18 via the optical fiber 16. The bar 12 is rapidly and uniformly heated by the successive internal reflections and absorption of the laser radiation. The heat is transferred from the bar 12 to the pads 34 through the intervening leads 32 and solder 38. The solder is melted and subsequently cools after removal of the bar 12 or the removal of the laser radiation. Thus, a plurality of leads are simultaneously soldered. The heater 10 may be attached to a conventional 3-axes positioning means for positioning the heater at predetermined locations relative to a stationary assemblage of components. Alternatively, the heater 10 may be translated in a single vertical axis while the substrate 36 is translated in one or two horizontal axes beneath the heater.

Figure 5:
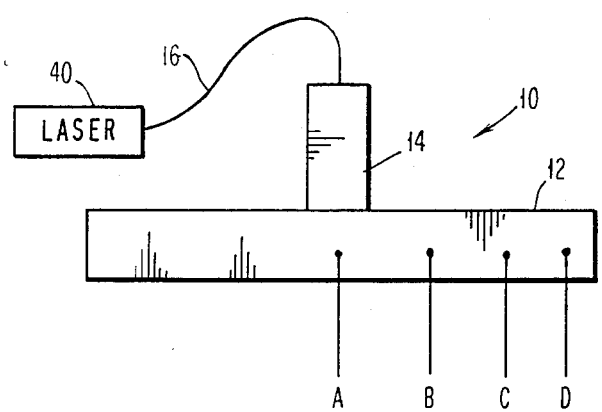
FIG. 5 illustrates a heater bar constructed in accordance with the invention and also the positioning of a plurality of thermocouples which were employed to generate the graph of FIG. 6.
Figure 6:
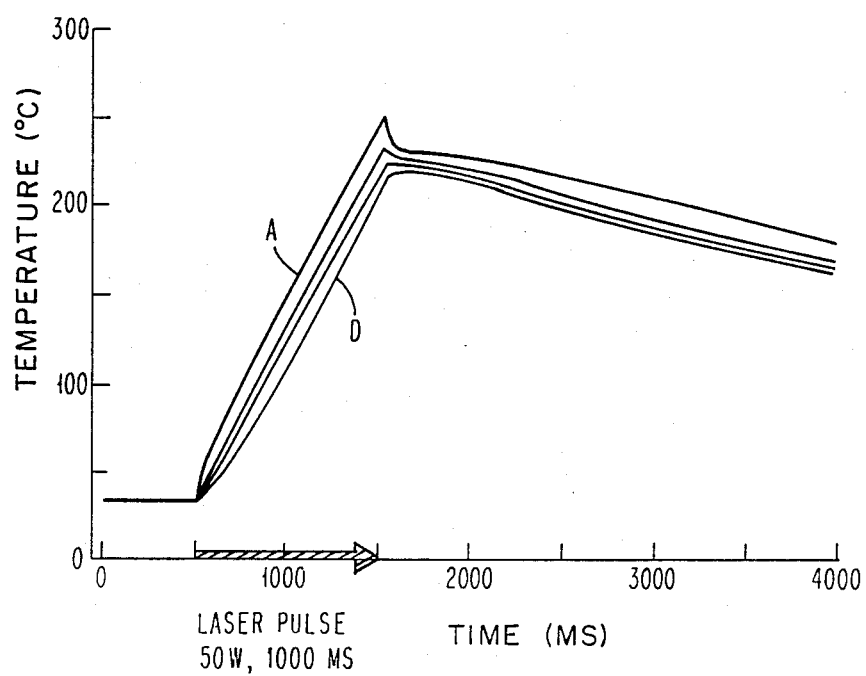
FIG. 6 is a graph which shows the temperature profile as a function of time of the heater bar of FIG. 5 during and after the application of a pulse of laser energy to the interior of the bar.

FIG. 5 illustrates the positions of four thermocouples (A-D) which were placed along the length of the bar 12, the bar 12 having a length of approximately 1.25 cm. A YAG (1.06 um) laser 40 operating in a CW mode was used to deliver 50 watts of laser energy for 1000 milliseconds (ms) to the heater 10. The resulting temperature profile is shown in the graph of FIG. 6. The bar 12 is observed to heat up at a substantially uniform rate of 223 degrees C. per second with a substantially constant temperature variation of approximately 40 degrees C. until the temperature of the bar exceeds 200 degrees C. In that eutectic solder melts at 183 degrees C. it can be realized that the heater 10 is operable for soldering leads along its entire length.

Although a Nd:YAG laser has been shown as the source of optical energy it should be appreciated that the heater of the invention may be powered by any suitable source of optical radiation. For example, argon ion and excimer lasers both have an output wavelength suitable for transmission through conventional optical fibers. One consideration is that the laser be capable of operating in a CW mode for an interval of time sufficient to raise the temperature of the heater to the desired point. In this regard Nd:YAG lasers operating in a CW mode and having an output wavelength suitable for transmission through an optical fiber are readily available.

The heater of the invention has been found to provide soldering attachment rates that are approximately one order of magnitude faster than the maximum rates associated with conventional direct laser soldering techniques. Similarly, when compared with conventional electrically operated heating devices ("hot blades") the heater of the invention is capable of greatly superior heating rates. In addition, the heating tool of the invention is significantly more compact than an equivalent electrical heater due to the nature of the power delivery. That is, the power is delivered through a hair-like optical fiber as opposed to the relatively much thicker electrical cables in an electrical heater. Physical size, weight and power delivery connections are considered to be critical factors in automating a component attachment process, especially for small devices with fine lead spacings.

The heater of the invention is especially applicable in situations where small component sizes and geometries limit the use of conventional heating devices and in situations where localized heating is required to prevent unnecessary heating of heat sensitive devices or printed circuit board material. The heater of the invention is also advantageous where the previous features need to be combined with high thruput levels. Examples of such applications include the soldering of surface mount components and Tape Automated Bonding (TAB) component attachment where lead spacing is typically 20 mils or less.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent:

1. Heater apparatus comprising:
    a thermally conductive body portion having an internal hollow cavity enclosed within, the cavity having surfaces substantially reflective to incident optical radiation and partially absorptive of the incident optical radiation such that said body portion is heated by the absorbed optical radiation; and
    means coupled to the cavity for delivering the optical radiation thereto, said delivering means being comprised of an optical fiber having an output end in optical communication with the cavity and an input end for coupling to a source of optical radiation.

2. Heater apparatus as set forth in claim 1 wherein said body portion is comprised of:
    a thermally conductive metallic substrate having the cavity disposed therein;
    a reflective metallic coating disposed over surfaces of the cavity; and
    an outer coating disposed over outer surfaces of the body portion, the outer coating being comprised of a material which is substantially non-wettable by molten solder.

3. Heater apparatus as set forth in claim 2 wherein said metallic substrate is comprised of copper, wherein said reflective metallic coating is comprised of titanium.

4. Heater apparatus as set forth in claim 3 and further comprising a barrier coating interposed between the copper substrate and the gold coating, the barrier coating being comprised of material which is suitable for substantially preventing the interdiffusion of the copper substrate and the gold coating.

5. Heater apparatus as set forth in claim 4 wherein the barrier coating is comprised of nickel.

6. Heater apparatus as set forth in claim 4 wherein the barrier coating is comprised of platinum.

7. Heater apparatus as set forth in claim 1 wherein said delivering means further comprises an optical fiber support member which is attached to said body portion.

8. Heater apparatus as set forth in claim 7 wherein said support member is an integral extension of said body portion.

9. Heater apparatus as set forth in claim 7 wherein said support member is comprised of material having a lower thermal conductivity than the thermal conductivity of said body portion.

10. Heater apparatus as set forth in claim 9 wherein said support member is comprised of stainless steel.

11. A heater bar having a length suitable for simultaneously heating a plurality of component leads for soldering each of the leads to an associated terminal comprising:
    a thermally conductive elongated member having an internal hollow cavity enclosed within, the cavity being disposed along substantially the entire length of said member and having surfaces substantially reflective to incident laser radiation and partially absorptive of the incident laser radiation such that said member is substantially uniformly heated along its length by the absorbed laser radiation; and
    an optical fiber having an output end in optical communication with the cavity and an input end in optical communication with a source of laser radiation for providing the laser radiation to the cavity.

12. A heater bar as set forth in claim 11 wherein said elongated member is comprised of:
    a thermally conductive metallic substrate having the cavity disposed therein;
    a reflective metallic coating disposed over surfaces of the cavity; and
    an outer coating disposed over outer surfaces of said metallic substrate, said outer coating being comprised of a material which is substantially non-wettable by molten solder.

13. A heater bar as set forth in claim 12 wherein said metallic substrate is comprised of copper, wherein said reflective metallic coating is comprised of gold and wherein said outer coating is comprised of titanium.

14. A heater bar as set forth in claim 13 and further comprising a barrier coating interposed between the copper substrate and the gold coating, the barrier coating being comprised of material which is suitable for substantially preventing the interdiffusion of the copper substrate and the gold coating.

15. A heater bar as set forth in claim 14 wherein the barrier coating is comprised of nickel.

16. A heater bar as set forth in claim 14 wherein the barrier coating is comprised of platinum.

17. A method of simultaneously soldering a plurality of leads each to an associated electrical terminal, comprising the steps of:
    providing each of the plurality of leads in contact with an associated electrical terminal and with a quantity of solder;
    contacting each of the plurality of leads with an elongated thermally conductive member;
    transmitting laser radiation from a source of laser radiation to a hollow elongated cavity which is enclosed within the member, the cavity being disposed along substantially an entire length of the member;

repetitively reflecting the laser radiation from internal surfaces of the cavity such that the laser radiation is substantially uniformly absorbed along the length of the cavity for heating the member substantially uniformly along its length; and transferring the heat from the member simultaneously into the plurality of leads such that the solder associated with each lead is melted.

18. A method as set forth in claim 17 wherein the step of transmitting is accomplished by activating a Nd:YAG laser for a period of time sufficient to heat the member to a temperature which exceeds the melting temperature of solder.

19. A method as set forth in claim 17 wherein the step of transmitting is accomplished by transmitting the laser radiation through an optical fiber having an output end in optical communication with the cavity.

* * * * *

UNITED STATES PATENT AND TRADEMARK OFFICE
CERTIFICATE OF CORRECTION

PATENT NO.  : 4,894,509

DATED       : January 16, 1990

INVENTOR(S) : Pedro A. Chalco and Joseph C. Andreshak

It is certified that error appears in the above-identified patent and that said Letters Patent is hereby corrected as shown below:

In Column 5, line 60, after "comprised of" insert --gold and wherein said outer coating is comprised of--.

Signed and Sealed this

Ninth Day of October, 1990

Attest:

HARRY F. MANBECK, JR.

Attesting Officer

Commissioner of Patents and Trademarks